United States Patent
Guetter et al.

(10) Patent No.: US 8,792,699 B2
(45) Date of Patent: Jul. 29, 2014

(54) MOTION TRACKING FOR CLINICAL PARAMETER DERIVATION AND ADAPTIVE FLOW ACQUISITION IN MAGNETIC RESONANCE IMAGING

(75) Inventors: Christoph Guetter, Lawrenceville, NJ (US); Jens Gühring, Erlangen (DE); Marie-Pierre Jolly, Hillsborough, NJ (US); Xiaoguang Lu, West Windsor, NJ (US); Hui Xue, Franklin Park, NJ (US); Jeremy Collins, Chicago, IL (US); Peter Weale, Menith Wood (GB)

(73) Assignees: Siemens Aktiengesellschaft, Munich (DE); Jeremy Collins, Chicago, IL (US)

( * ) Notice: Subject to any disclaimer, the term of this patent is extended or adjusted under 35 U.S.C. 154(b) by 256 days.

(21) Appl. No.: 13/239,530

(22) Filed: Sep. 22, 2011

(65) Prior Publication Data

US 2012/0076382 A1    Mar. 29, 2012

Related U.S. Application Data

(60) Provisional application No. 61/387,590, filed on Sep. 29, 2010, provisional application No. 61/388,140, filed on Sep. 30, 2010, provisional application No. 61/412,455, filed on Nov. 11, 2010, provisional application No. 61/390,648, filed on Oct. 7, 2010.

(51) Int. Cl.
    *G06K 9/00*        (2006.01)
(52) U.S. Cl.
    USPC ........................................................ 382/131

(58) Field of Classification Search
    None
    See application file for complete search history.

(56) References Cited

U.S. PATENT DOCUMENTS

| | | | |
|---|---|---|---|
| 5,435,310 A * | 7/1995 | Sheehan et al. | 600/416 |
| 7,963,925 B1 * | 6/2011 | Schecter | 600/508 |
| 8,131,043 B2 * | 3/2012 | Binkley et al. | 382/131 |
| 8,199,994 B2 * | 6/2012 | Amir | 382/131 |
| 8,280,136 B2 * | 10/2012 | Gotardo et al. | 382/131 |
| 2002/0072672 A1 * | 6/2002 | Roundhill et al. | 600/450 |
| 2003/0031357 A1 * | 2/2003 | Wenzel et al. | 382/154 |
| 2003/0153823 A1 * | 8/2003 | Geiser et al. | 600/407 |
| 2003/0160786 A1 * | 8/2003 | Johnson | 345/419 |
| 2004/0223636 A1 * | 11/2004 | Edic et al. | 382/131 |
| 2007/0014452 A1 * | 1/2007 | Suresh et al. | 382/128 |
| 2008/0085043 A1 * | 4/2008 | Watanabe et al. | 382/131 |
| 2009/0231335 A1 * | 9/2009 | Von Berg et al. | 345/420 |
| 2012/0087561 A1 * | 4/2012 | Guetter et al. | 382/131 |

* cited by examiner

*Primary Examiner* — Nancy Bitar (57) ABSTRACT

A method for clinical parameter derivation and adaptive flow acquisition within a sequence of magnetic resonance images includes commencing an acquisition of a sequence of images. One or more landmarks are automatically detected from within one or more images of the sequence of images. The detected one or more landmarks are propagated across subsequent images of the sequence of images. A plane is fitted to the propagation of landmarks. The positions of landmarks or alternatively the position of the fitted plane within the sequence of images is used for derivation of clinical parameters such as tissue velocities and/or performing adaptive flow acquisitions to measure blood flow properties.

19 Claims, 5 Drawing Sheets

MOTION TRACKING FOR CLINICAL PARAMETER DERIVATION AND ADAPTIVE FLOW ACQUISITION IN MAGNETIC RESONANCE IMAGING

CROSS-REFERENCE TO RELATED APPLICATIONS

The present application is based on provisional application Ser. Nos. 61/387,590, filed Sep. 29, 2010; 61/388,140, filed Sep. 30, 2010; 61/390,648, filed Oct. 7, 2010; and 61/412,455, filed Nov. 11, 2010 the entire contents of which are herein incorporated by reference in their entirety.

BACKGROUND

1. Technical Field

The present disclosure relates to magnetic resonance imaging (MRI) and, more specifically, to motion tracking for clinical parameter derivation and adaptive flow acquisition in MRI.

2. Discussion of Related Art

Magnetic resonance angiography (MRA) is a field of medical imaging that uses magnetic resonance imaging (MRI) to study blood vessels. One particular example of MRA is phase-contrast flow acquisition, also known as phase-contrast MRA. In phase-contrast flow acquisition the flow of blood through vessels may be imaged and analyzed to provide imagery and to quantify various parameters such as the speed of blood flow. The resulting imagery and quantified parameters may have significant diagnostic value and may facilitate life-saving intervention.

BRIEF SUMMARY

A method for performing flow acquisition within a sequence of magnetic resonance images includes commencing an acquisition of a sequence of images. One or more landmarks are automatically detected from within one or more images of the sequence of images. The detected one or more landmarks are propagated across subsequent images of the sequence of images. An image acquisition plane is fitted to the propagation of landmarks. One or more flow properties are determined from the sequence of images within the fitted image acquisition plane.

A method for determining tissue velocities within a sequence of magnetic resonance images includes commencing an acquisition of a sequence of images. One or more landmarks are automatically detected from within one or more images of the sequence of images. The detected one or more landmarks are propagated across subsequent images of the sequence of images. An image acquisition plane is fitted to the propagation of landmarks. One or more tissue velocities are determined from the sequence of images within the fitted image acquisition plane.

Determining one or more tissue velocities may include determining one or more clinical parameters. Additionally, or alternatively, determining one or more tissue velocities includes determining an S' velocity, an A' velocity, or an E' velocity.

The sequence of images may include a sequence of magnetic resonance (MR) image frames. The one or more landmarks may include a point of the mitral valve, a point of the tricuspid valve, or a point of the aortic valve. The detection of the landmarks may be performed in conjunction with detection of one or more apex points of the myocardium and the detection of the apex points may be used to bolster the detection of the valve points by providing additional anchoring points.

The detected one or more landmarks may be propagated over all phases of a cardiac cycle. The propagation of the one or more landmarks may include transforming a landmark from a starting phase to another phase using deformation fields. The deformation fields may be computed using an inverse-consistent deformable registration algorithm.

Determining the one or more flow properties may include determining a mitral valve annulus velocity. Determining the one or more flow properties may include determining a velocity of each landmark computed from the propagated movement of the landmark from one phase to another within the image acquisition plane. Determining the one or more flow properties may include determining an S' velocity, an A' velocity, or an E' velocity.

The one or more landmarks may include a mitral valve insertion point and an extent of a left ventricle may be derived from the propagated location of the mitral valve insertion point.

Propagating the detected one or more landmarks may include modeling or forecasting where each of the landmarks are likely to be found based on where they have been most recently and at other occasions at a similar point within the cardiac cycle.

Fitting the image acquisition plane to the propagation of landmarks may include finding a plane that minimizes an orthogonal distance between the landmarks and the plane and occupies a point that is calculated to be the center of all landmarks taken together.

A system for performing flow acquisition within a sequence of magnetic resonance images includes a medical imaging device for commencing an acquisition of a sequence of images. An image processing device includes a landmark detection module, a propagation module, and a structure fitting module. The landmark detection module automatically detects one or more landmarks from within one or more images of the sequence of images. The propagation module propagates the detected one or more landmarks across subsequent images of the sequence of images. The structure fitting module fits a geometric plane to the propagation of landmarks.

A method for deriving mitral annulus velocity within a sequence of magnetic resonance images includes commencing an acquisition of a sequence of images, automatically detecting one or more mitral valve insertion points, propagating the detected mitral valve insertion points across subsequent images of the sequence of images, fitting a plane to the propagation of valve insertion points, and determining a velocity of the mitral annulus from the sequence of images within the fitted plane.

The method may additionally include determining an extent of a left ventricle from the determined velocity of the mitral annulus.

Fitting the valve plane to the propagation of the mitral valve insertion points may include finding a plane that minimizes an orthogonal distance between the mitral valve insertion points and the plane and occupies a point that is calculated to be the center of all mitral valve insertion points taken together.

The detection of the mitral valve insertion points may be performed in conjunction with detection of one or more apex points of the myocardium and the detection of the apex points may be used to bolster the detection of the mitral valve insertion points by providing additional anchoring points.

Propagation of the one or more mitral valve insertion points may include transforming the mitral valve insertion points from a starting phase to another phase using deformation fields that are computed using an inverse-consistent deformable registration algorithm.

A method for determining clinical parameters within a sequence of images, includes commencing an acquisition of a sequence of images, automatically detecting one or more landmarks from within one or more images of the sequence of images, propagating the detected one or more landmarks across subsequent images of the sequence of images, and determining one or more clinical parameters from the propagation of landmarks.

BRIEF DESCRIPTION OF THE SEVERAL VIEWS OF THE DRAWINGS

A more complete appreciation of the present disclosure and many of the attendant aspects thereof will be readily obtained as the same becomes better understood by reference to the following detailed description when considered in connection with the accompanying drawings, wherein.

DETAILED DESCRIPTION

In describing exemplary embodiments of the present disclosure illustrated in the drawings, specific terminology is employed for sake of clarity. However, the present disclosure is not intended to be limited to the specific terminology so selected, and it is to be understood that each specific element includes all technical equivalents which operate in a similar manner.

Exemplary embodiments of the present invention seek to provide phase-contrast flow acquisition for vessels and valves that may be subject to cardiac motion. Phase-contrast flow acquisition may be used to measure the frame-to-frame velocity of each pixel within a sequence of medical image frames. Phase-contrast acquisition may be performed directly at the location of the cardiac valves in order to determine and/or measure the flow velocity of blood through the valves. Phase-contrast may be acquired as a 2D flow measurement by measuring the flow through individual pixels at the acquisition location. From this data, parameters such as average blood velocity, peak blood velocity, and peak blood flow through a blood vessel may be determined. Moreover, the shunt flow, or the aortic or pulmonary regurgitation may be determined. Accordingly, significant diagnostic value may be gleamed from phase-contrast flow acquisition.

Phase-contrast flow acquisition may be particularly difficult to perform when used to analyze the flow characteristics of blood traveling through vessels and valves that are themselves subject to motion such as cardiac motion. Under cardiac motion, the valves may move up and down over time due to the beating of the heart. Therefore, if an acquisition plane of the medical imaging device remains fixed, the valves of interest may move in and out of the image plane and the flow measurement may become inaccurate.

Exemplary embodiments of the present invention provide for a dynamic acquisition plane within cine acquisitions for performing phase-contrast flow acquisition. The motion of the image plane may be automatically tracked by automatically determining the position of the valves, for example, at the valve plane, for which phase-contrast flow acquisition is to be performed within. Then, the position of the valves over time may be tracked in long-axis images of the heart. The valve plane may be tracked in three-dimensions and its motion may be effectively modeled so that phase-contrast flow acquisition may be accurately performed even as the valve continues to move in accordance with the heartbeat.

Exemplary embodiments of the present invention may utilize three core components. The first component is landmark detection. It is here that key anatomical landmarks are identified within medial image data. The landmarks used may include cardiac valves. The second component is propagation of landmarks. It is here that the location and movement of each of the detected landmarks are analyzed and expected motion predicted. The third component is shape fitting. It is here that a geometric shape is fitted to the propagated landmarks.

Exemplary embodiments of the present invention may utilize one or more of the above-described components to perform one or more of the following objectives. The first objective is flow acquisition. Flow acquisition may be performed by first detecting valves as landmarks within an image frame. Then, the valve landmarks may be propagated through subsequent image frames. Next, a geometric plane may be fitted to the propagated valve landmarks and its coordinates may then be used to determine the acquisition plane. Then, within the acquisition plane, the velocity of each pixel may be analyzed to determine various flow acquisition parameters.

The second objective is mitral annulus velocity determination. Exemplary embodiments of the present invention may perform mitral annulus velocity determination by first detecting, within an image frame, the lateral and septal mitral valve insertion points as landmarks. Then, the insertion points may be propagated through subsequent image frames. Then, a 3D valve plane may be fitted to all propagated insertion points. The velocity of the tracked insertion points may then be determined based on the tracking of the valve planes.

Figure 1:
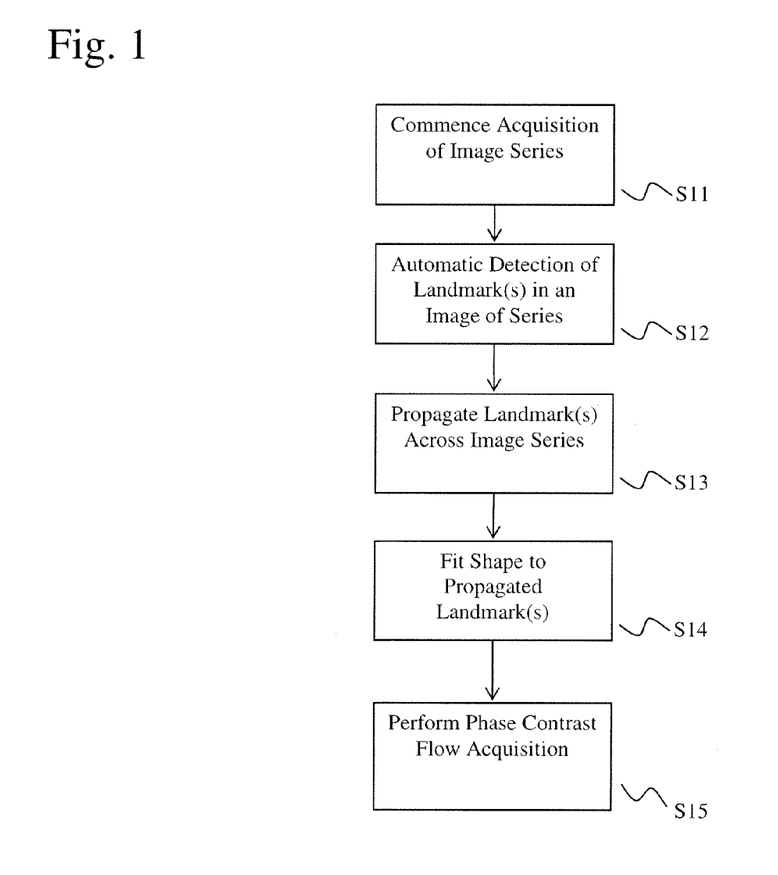
FIG. 1 is a flowchart illustrating an approach for performing phase-contrast flow acquisition within a medical image according to exemplary embodiments of the present invention.

FIG. 1 is a flowchart illustrating an approach for performing phase-contrast flow acquisition within a medical image according to exemplary embodiments of the present invention. First, acquisition of a cine medical image may be commenced (Step S11). The cine medical image may be a set of several medical image frames acquired over time, for example, using an MRI, although exemplary embodiments of the present invention may be applied to other forms of medical imaging such as ultrasounds, fluoroscopic images, computed tomography (CT) images and the like. Automatic landmark detection may then be used to automatically extract one or more landmarks from frames of the acquired medical image sequence (Step S12). The landmarks may include one or more valves or valve points. For example, the mitral valve may be used as the landmark. Another example of a suitable landmark is the tricuspid valve. The aortic valve may also be used as a suitable landmark. It should be understood that while cardiac valves are offered as examples of suitable landmarks, other anatomical structures may be used in accordance with exemplary embodiments of the present invention.

Next, the extracted landmarks may be propagated over time over all phases of the cardiac cycle (Step S13). Propagation of the extracted landmarks may include determining the location of the landmarks in subsequent image frames based on the known location of the landmarks from a prior image frame. Here, propagation may include the transformation of a landmark or contour from one starting phase to other phases and/or frames using deformation fields that may be computed by an inverse-consistent deformable registration algorithm. Propagation may be said to span all phases of the cardiac cycle when the one or more landmarks have been effectively located within image frames that span at least one full cardiac cycle, including systole and diastole periods.

Propagation of the landmarks may be performed geometrically. Accordingly, the propagated landmarks may be fitted to a high-dimensional structure, for example, a plane. Propagation may be two fold, first the deformation fields may be used and then, the landmark propagation may be further constrained by a geometric structure. The geometrically propagated, detected landmarks may be fitted to a high-dimensional structure as part of the image sequence. By doing so, the geometric consistency may be provided by the propagation function and outliers may be treated or prevented by the fitting.

One such geometrical object may be a plane that may then be fitted to the cine medical image frames based on the locations of the propagated landmarks (Step S14). The plane may be fitted to multiple long axis slices of the medical image such as those that cross the locations of the propagated landmarks. Where the landmarks are one or more points of the mitral valve, the plane may include the mitral valve plane. Where the landmarks are one or more points of the tricuspid valve, the plane may include the tricuspid valve plane as imaged in the 4-chamber long axis view of the heart. Where the landmarks are one or more points of the aortic valve, the plane may include the aortic valve as imaged by 3-chamber long axis images or left ventricular outflow tract (LVOT) images.

Phase-contrast flow acquisition may then be performed within the fitted plane that may be translated to a format understood by the phase-contrast acquisition algorithm (Step S15).

Figure 2:
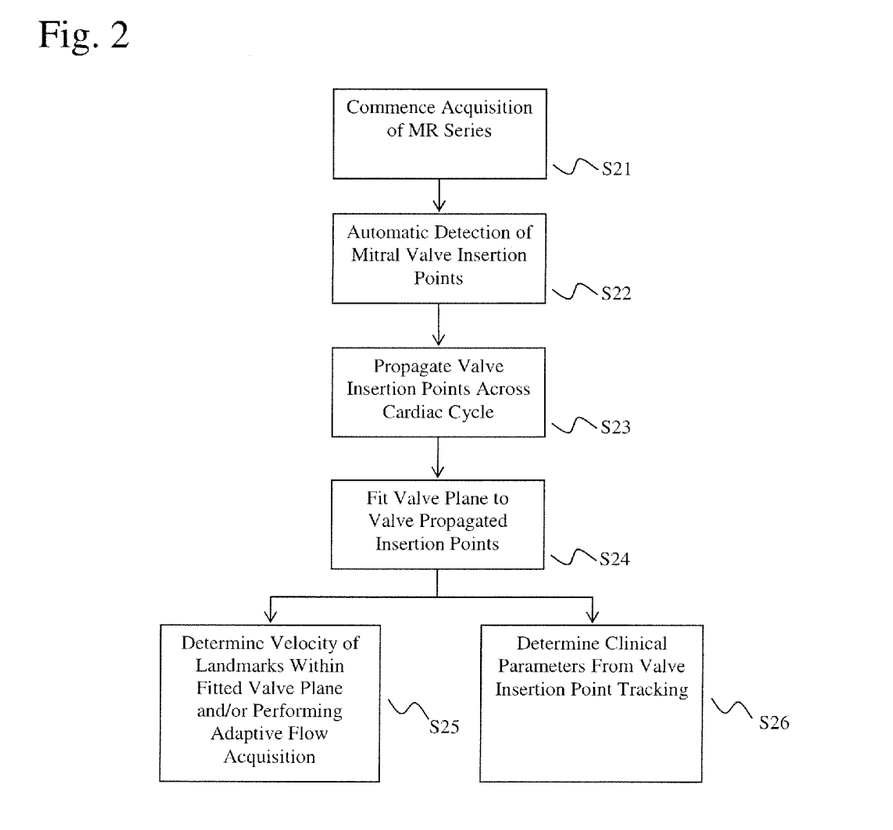
FIG. 2 is a flowchart illustrating an approach for determining mitral valve annulus velocity according to exemplary embodiments of the present invention.

As described above, exemplary embodiments of the present invention are not limited to performing phase-contrast flow acquisitions. For example, exemplary embodiments of the present invention may be used to determine mitral valve annulus velocity. Mitral valve annulus velocity is an increasingly important index of diastolic function. In general, mitral valve annulus velocity may be determined from echo data such as tissue Doppler imaging (TDI). However, exemplary embodiments of the present invention may be used to determine mitral valve annulus velocity from routine MR acquisitions. FIG. 2 is a flowchart illustrating an approach for determining mitral valve annulus velocity according to exemplary embodiments of the present invention.

First, acquisition of a cine MR image may be commenced (Step S21). The cine MR image may be, for example, a routine MR acquisition such as a cardiac MR image sequence. While the MR acquisition may utilize any practical temporal resolution, a temporal resolution of one MR image frame acquisition every 30 ms may be suitable. Automatic landmark detection may then be used to automatically extract one or more landmarks from frames of the acquired medical image (Step S22). In particular, one or more points of the mitral valve may be used as landmarks and accordingly, the mitral valve may be automatically identified within the medical image. Examples of suitable landmarks include the lateral and septal mitral valve insertion points. Next, the extracted mitral valve landmark(s) may be propagated over time over all phases of the cardiac cycle (Step S23). As described above, propagation of the landmarks may include a tracking of each landmark within the medical image set based on prior identified locations such as prior locations during corresponding points within the cardiac cycle. Tracking of the lateral and septal mitral valve insertion points may be performed, for example, using an inverse-consistent deformable registration algorithm. It should be noted that the same algorithm may be used to track the flow acquisition plane may be used to propagate the landmarks over time. In this way, a single algorithm may serve both applications. A detailed description of the propagation/registration algorithm is provided below.

The inverse-consistent deformable registration algorithm may be a registration method for computing symmetric and inverse-consistent image alignment efficiently while preserving high accuracy and consistency of the transformation. This may be achieved by optimizing a symmetric energy functional estimating forward and backward transformations constrained by the transformations being inverse to each other. The inverse-consistent deformable registration algorithm may be employed to provide consistent, highly accurate image alignment within a practically accepted timeframe.

The inverse-consistent deformable registration algorithm may be implemented as a quasi-symmetric cost function resulting in a quasi-symmetric registration. According to this approach, the registration direction may be swapped after each iteration step until convergence is reached. At each change of direction, an inverse transformation may be estimated and used as the input forward deformation field for the next iteration. The formulation may also include an inverse consistency error energy that may be enforced after convergence is reached by eliminating any residual error between forward and estimated inverse transformation.

A plane may then be fitted to the cine medical image frames based on the locations of the propagated landmarks (Step S24). As described above, the plane may include the mitral valve plane.

Figure 3:
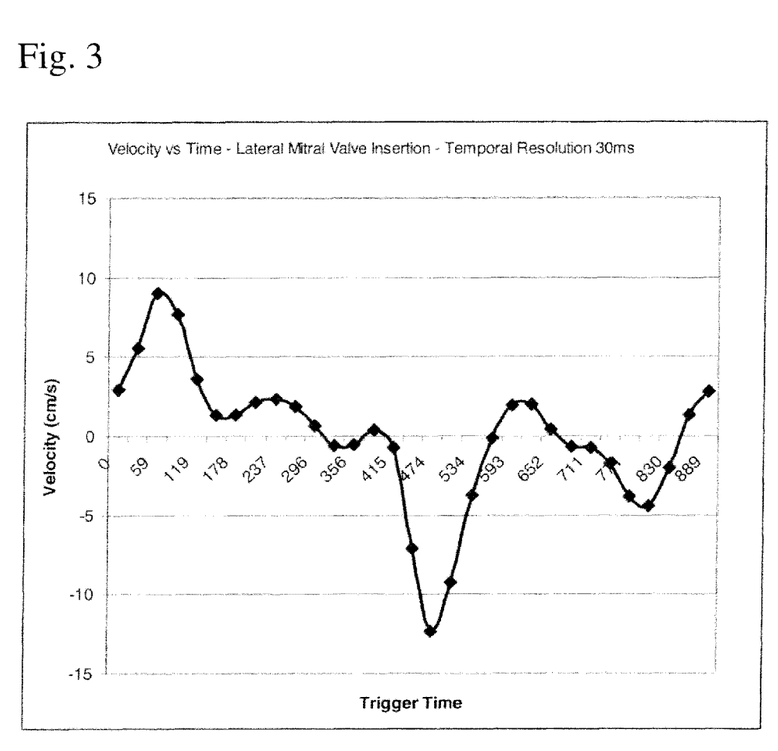
FIG. 3 is a chart illustrating mitral annulus velocity over trigger time according to an exemplary embodiment of the present invention.

Landmark velocities may be calculated throughout the cardiac MR image sequence (Step S25). Each landmark velocity may be defined as the rate of change of position of the landmark with respect to the plane. For example, the plane may be defined in 3D space and the velocity of each landmark may be computed from the movement of the landmark from one phase to another with respect to that plane. Landmark velocities may accordingly be calculated throughout at least one full cardiac cycle. The results may be graphed as a curve illustrating the mitral annulus velocity, for example, in cm/s, over the cardiac cycle, for example, as measured in trigger times. The resolution of the points on the curve may represent the temporal resolution of the image acquisition, for example, there may be a data point every 30 ms where the selected temporal resolution for the MR scan is 30 ms. FIG. 3 is a chart illustrating mitral annulus velocity over trigger time according to an exemplary embodiment of the present invention.

Tissue velocities may be determined from the tracked landmarks. Tissue velocities may reflect, for example, how tissue, such as that of the heart chambers, moves. These tissue velocities may be expressed as clinical parameters. Accordingly, clinical parameters may additionally or alternatively be derived from the valve point tracking (Step S26). Examples of clinical parameters that may be so derived include S', A' as well as E' tissue velocities. All three velocities may be measured as the mitral annulus movement toward or away from the apex. S', or S prime, refers to a "forward" velocity during systole, whereas E', or Em, and A', or Am, are two "away" velocities during the early (E') and the atrial (A') phases of the diastole. The derived clinical parameters and/or the derived mitral annulus velocities may then be used to assess left and/or right ventricular diastolic function. Accordingly, the assessment may be performed by a clinician based on automated derivation of the clinical parameters. Additionally, the extent of the LV may be derived from the location of the mitral valve insertion point.

Figure 4:
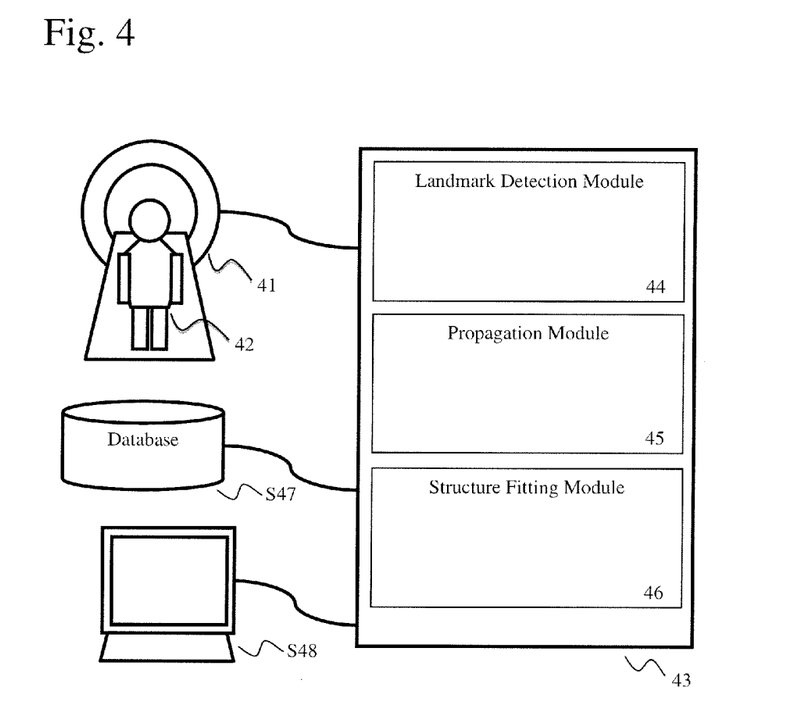
FIG. 4 is a diagram illustrating a relationship of the various modules according to exemplary embodiments of the present invention.

The above-described methods may be implemented by combining various modules. FIG. 4 is a diagram illustrating a relationship of the various modules according to exemplary embodiments of the present invention. A medical imaging device 41, for example, an MRI scanner, may be used to image a patient 42. The acquired image sequence may be transmitted to an image processing device 43. The image processing device 43 may include multiple modules 44-46. Each of the included modules may be implemented by software running on a data processing device such as a computer. The same image processing device may be used for executing the software for one or more of the modules.

A landmark detection module 44 may be responsible for automatically detecting one or more landmarks within the acquired image. A propagation module 45 may then be responsible for automatically propagating the detected landmarks throughout the image sequence. A structure fitting module 46 may then be used to fit a structure to the image sequence based on the propagated landmarks. For example, the structure fitting module may be responsible for fitting the imaging plane. However, exemplary embodiments of the present invention are not limited to the fitting of an imaging plane, and any arbitrary structure may be fit as the need arises. For example, plane fitting may be substituted by line fitting or mesh fitting depending upon the underlying structure that is to be estimated.

Other modules may also be included within the image processing device 43. For example, modules may be used to calculate landmark velocities and other diagnostic parameters. The image processing device 43 may be able to output diagnostic information such as a graph of landmark velocities to a medical records database 47 and/or a display/console device 48.

Various details concerning each module are discussed below.

As discussed above, the landmark detection module may be responsible for automatically detecting one or more landmarks within the acquired image. Accordingly, the landmark detection module may be used to automatically detect the valve insertion points for the landmark used on a long axis cardiac cine image of the left ventricle. The landmarks used may include the mitral valve, the aortic valve, or the tricuspid valve.

The landmark detection module may employ an anchoring component to locate the presence of a specific landmark, which may be in this case; the valve insertion points for the landmark used, for example, the mitral valve insertion points. The valve insertion point may be represented as a bounding box with various parameters such as two parameters of translation, one parameter of orientation, and two parameters of scale. A probabilistic boosting tree may then be used to classify each pixel of the image as either object or background. A probabilistic boosting tree (PBT) is an example of a generic classifier that may be used; however, other forms of classifiers may be used in addition to or in place of the PBT. Performance of PBT varies for different parameter settings such as the tree depth and the number of weak classifiers in each node. These parameters may be adjusted for individual applications. Marginal space learning may be used to reduce the computational cost associated with searching through the relatively large five-dimensional parameter space. While any search order may be used in the marginal space learning, a suitable order may include position followed by orientation, and then scale.

Detection of the valve points may be performed in conjunction with a detection of the apex points of the myocardium. The detection of the apex points may be used to bolster the detection of the valve points by providing additional anchoring points; however, both anchoring components may first be detected independently in a first stage and then multiple hypotheses may be maintained at each stage of the marginal space learning algorithm used. Those hypotheses that satisfy the joint contextual model for apex and valve points may be maintained.

As discussed above, the propagation module may be responsible for automatically propagating the detected landmarks throughout the image sequence. The propagation module may serve to propagate each of the detected valve points from image to all other images on a frame-to-frame basis. Propagation may include a modeling and/or forecasting of where the landmarks are likely to be found based on where they have been most recently and at other occasions at a similar point within the cardiac cycle. Propagation may employ, for example, an inverse-consistent image registration algorithm or another suitable registration approach.

As discussed above, the structure fitting module may be used to fit a structure to the image sequence based on the propagated landmarks. The structure to be fitted may be a geometric plane. Landmark detection may be performed on one image frame at a time. The structure may then be fitted to the detected and propagated landmarks. When multiple different long axis images are available, steps may be taken to ensure that the propagated valve points are consistent. This may be accomplished, for example, by measuring a distance in three dimensions between the centers of the detected valve points along each of the multiple long axis planes. Valve points may be retained provided that the distance between their centers is below a predetermined threshold, which may be, for example, less than a short axis slice spacing. Such an approach, or other approaches, may be used to prevent gross errors such as the inclusion of the papillary muscles within the fitted imaging plane.

In the event that multiple different long axis slices are available, the plane may be fit through the N mitral valve landmarks. The location of each mitral valve landmark may be defined as existing at the coordinates $(x_i, y_i, z_i)$ where i is a number between zero and N that represents the particular mitral valve landmark. Fitting may be performed using a least squares approach or another suitable approach to fitting. For his purpose, a covariance matrix A may be defined as:

$$A = \begin{bmatrix} \sum_{i=0}^{N}(x_i-x_c)^2 & \sum_{i=0}^{N}(x_i-x_c)\times(y_i-y_c) & \sum_{i=0}^{N}(x_i-x_c)\times(z_i-z_c) \\ \sum_{i=0}^{N}(x_i-x_c)\times(y_i-y_c) & \sum_{i=0}^{N}(y_i-y_c)^2 & \sum_{i=0}^{N}(y_i-y_c)\times(z_i-z_c) \\ \sum_{i=0}^{N}(x_i-x_c)\times(z_i-z_c) & \sum_{i=0}^{N}(y_i-y_c)\times(z_i-z_c) & \sum_{i=0}^{N}(z_i-z_c)^2 \end{bmatrix}$$

Here, $(x_c, y_c, z_c)$ represents the center of all landmarks taken together. The plane may then be defined as occupying by the point $P=(x_c, y_c, z_c)$ and the vector normal to the plane may be defined from the single value decomposition of $A=UWV^{-1}$.

Least squares fitting of a plane to a set of points may be solved by minimizing the orthogonal distance between the points and the plane. The plane that minimizes this distance may go through the center of the points and its normal may be the eigenvector corresponding to the smallest eigenvalue. The singular value decomposition of a matrix A generates the eigenvalues in the diagonal matrix W and the eigenvectors in the matrices U and V.

The term $\hat{k}$ may then be defined as the index k for which the eigenvalue $W(k)$ is minimum: $\hat{k}=\arg\min_k(W(k))$. The normal may then be defined as the $\hat{k}^{th}$ column of the matrix U, namely $\vec{n}=(U(0,\hat{k}),U(1,\hat{k}),U(2,\hat{k}))$. Accordingly, the normal may be found as the eigenvector with the smallest eigenvalue.

Where there is only one long axis slice available, the vector normal to the plane may be determined by combining the two landmarks with the shortest axis direction $\vec{D}$: $\vec{n}=\vec{L}\times(\vec{L}\times\vec{D})$ where $\vec{L}=(x_2-x_1, y_2-y_1, z_2-z_1)$.

While the disclosure above discusses, in detail, processes by which motion of various landmarks such as myocardial valves may be tracked for the purposes of performing phase contrast flow acquisition, it should be understood that the above-described approach for tracking landmarks need not be limited to the performance of phase contrast flow acquisition or the determination of any blood flow parameters for that matter. There may be any number of reasons why it may be desired to track the movement of landmarks such as myocardial valves and exemplary embodiments of the present invention may be limited to this tracking in the absence of performing phase contrast flow acquisition.

Additionally, exemplary embodiments of the present invention are not limited to the fitting of a plane of image acquisition to the tracked landmarks and indeed any desired shape may be fitted to the tracked landmarks or the landmarks may be tracked for other purposes that do not require shape fitting. Each of these permutations should be understood as falling within the scope of the present inventive concept.

Figure 5:
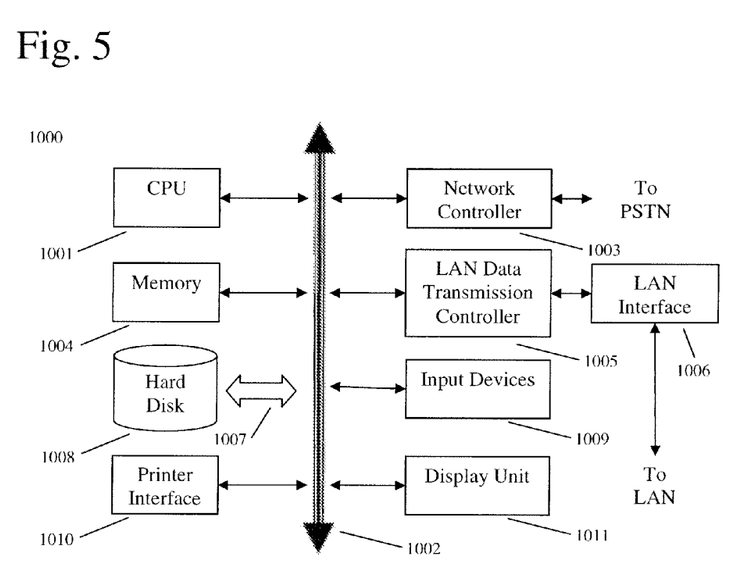
FIG. 5 shows an example of a computer system capable of implementing the method and apparatus according to embodiments of the present disclosure.

FIG. 5 shows an example of a computer system which may implement a method and system of the present disclosure. The system and method of the present disclosure may be implemented in the form of a software application running on a computer system, for example, a mainframe, personal computer (PC), handheld computer, server, etc. The software application may be stored on a recording media locally accessible by the computer system and accessible via a hard wired or wireless connection to a network, for example, a local area network, or the Internet.

The computer system referred to generally as system 1000 may include, for example, a central processing unit (CPU) 1001, random access memory (RAM) 1004, a printer interface 1010, a display unit 1011, a local area network (LAN) data transmission controller 1005, a LAN interface 1006, a network controller 1003, an internal bus 1002, and one or more input devices 1009, for example, a keyboard, mouse etc. As shown, the system 1000 may be connected to a data storage device, for example, a hard disk, 1008 via a link 1007.

Exemplary embodiments described herein are illustrative, and many variations can be introduced without departing from the spirit of the disclosure or from the scope of the appended claims. For example, elements and/or features of different exemplary embodiments may be combined with each other and/or substituted for each other within the scope of this disclosure and appended claims.

What is claimed is:

1. A method for performing flow acquisition within a sequence of images being a sequence of magnetic resonance images, comprising a processor:
   commencing an acquisition of a sequence of images;
   automatically detecting one or more landmarks from within one or more long axis cardiac images of the sequence of images, the one or more landmarks including a valve point;
   propagating the detected one or more landmarks across subsequent images of the sequence of images, including applying a deformable registration of the detected one or more landmarks across the subsequent images to predict a position of the one or more landmarks, wherein propagation comprises transforming a landmark from a starting phase to another phase using deformation fields and the deformation fields are computed using an inverse-consistent deformable registration algorithm;
   fitting an image acquisition plane to the propagation of landmarks in long axis cardiac images; and
   determining one or more flow properties from the sequence of images within the fitted image acquisition plane.

2. The method of claim 1, wherein the sequence of images comprises a sequence of magnetic resonance (MR) image frames.

3. The method of claim 1, wherein the one or more landmarks include a point of the mitral valve, a point of the tricuspid valve, or a point of the aortic valve.

4. The method of claim 3, wherein the detection of the landmarks is performed in conjunction with detection of one or more apex points of the myocardium and the detection of the apex points is used to bolster the detection of the valve points by providing additional anchoring points.

5. The method of claim 1, wherein detected one or more landmarks are propagated over all phases of a cardiac cycle.

6. The method of claim 1, wherein determining the one or more flow properties includes determining a mitral valve annulus velocity.

7. The method of claim 1, wherein determining the one or more flow properties includes determining a velocity of each landmark computed from the propagated movement of the landmark from one phase to another within the image acquisition plane.

8. The method of claim 1, wherein the one or more landmarks include a mitral valve insertion point and an extent of a left ventricle is derived from the propagated location of the mitral valve insertion point.

9. The method of claim 1, wherein propagating the detected one or more landmarks includes modeling or forecasting where each of the landmarks are likely to be found based on where they have been most recently and at other occasions at a similar point within the cardiac cycle.

10. The method of claim 1, wherein fitting the image acquisition plane to the propagation of landmarks includes finding a plane that minimizes an orthogonal distance between the landmarks and the plane and occupies a point that is calculated to be the center of all landmarks taken together.

11. A system for performing flow acquisition within a sequence of images being a sequence of magnetic resonance images, comprising:
   a medical imaging device for commencing an acquisition of a sequence of images; and
   an image processing device including a landmark detection module, a propagation module, and a structure fitting module, wherein the landmark detection module automatically detects one or more landmarks from within one or more long axis cardiac images of the sequence of images, the one or more landmarks including a valve point;

the propagation module propagates the detected one or more landmarks across subsequent images of the sequence of images, including applying a deformable registration of the detected one or more landmarks across the subsequent images to predict a position of the one or more landmarks, wherein propagation comprises transforming a landmark from a starting phase to another phase using deformation fields and the deformation registration is computed using an inverse-consistent deformable registration algorithm; and the structure fitting module fits a geometric plane to the propagation of landmarks.

12. A method for determining tissue velocities within a sequence of images being a sequence of magnetic resonance images, comprising a processor:

commencing an acquisition of a sequence of images;

automatically detecting one or more landmarks from within one or more long axis cardiac images of the sequence of images;

propagating the detected one or more landmarks across subsequent images of the sequence of images, including applying a deformable registration of the detected one or more landmarks across the subsequent images to predict a position of the one or more landmarks, wherein propagation comprises transforming a landmark from a starting phase to another phase using deformation fields and the deformation fields are computed using an inverse-consistent deformable registration algorithm;

fitting a plane object to the propagation of landmarks in one or more long axis cardiac images; and determining one or more tissue velocities from the sequence of images within the fitted plane.

13. The method of claim 12, wherein determining one or more tissue velocities includes determining one or more clinical parameters.

14. The method of claim 12, wherein determining one or more tissue velocities includes determining an S' velocity, an A' velocity, or an E' velocity.

15. The method of claim 12, wherein the one or more landmarks comprise mitral valve insertion points, the plane object is a mitral valve plane, and determining tissue velocities includes determining a velocity of the mitral annulus.

16. The method of claim 15 additionally including determining an extent of a left ventricle from the determined velocity of the mitral annulus.

17. The method of claim 15, wherein fitting the valve plane to the propagation of the mitral valve insertion points includes finding a plane that minimizes an orthogonal distance between the mitral valve insertion points and the plane and occupies a point that is calculated to be the center of all mitral valve insertion points taken together.

18. The method of claim 15, wherein the detection of the mitral valve insertion points is performed in conjunction with detection of one or more apex points of the myocardium and the detection of the apex points is used to bolster the detection of the mitral valve insertion points by providing additional anchoring points.

19. The method of claim 15, wherein propagation of the one or more mitral valve insertion points comprises transforming the mitral valve insertion points from a starting phase to another phase using the deformation fields.

* * * * *